(12) United States Patent
Morozov et al.

(10) Patent No.: US 8,847,698 B2
(45) Date of Patent: Sep. 30, 2014

(54) HIGH-SPEED FEEDTHROUGH HAVING A STAIR-LIKE SHAPE TRANSMISSION LINE FORMED THROUGH A MULTI-LAYER SUBSTRATE

(75) Inventors: Nikolai Morozov, Castro Valley, CA (US); Zhong Pan, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 361 days.

(21) Appl. No.: 13/278,696

(22) Filed: Oct. 21, 2011

(65) Prior Publication Data
US 2012/0098615 A1     Apr. 26, 2012

Related U.S. Application Data

(60) Provisional application No. 61/405,537, filed on Oct. 21, 2010.

(51) Int. Cl.
*H01P 5/02*     (2006.01)
*H01P 3/00*     (2006.01)

(52) U.S. Cl.
CPC ............... *H01P 3/003* (2013.01); *H01P 5/028* (2013.01); *H01P 5/022* (2013.01)
USPC .............................. 333/33; 333/246; 333/247

(58) Field of Classification Search
CPC ............ H01P 5/02; H01P 5/022; H01P 3/08; H01P 3/082; H01P 3/088; H01P 5/028
USPC ........................................ 333/33, 34, 246, 247
See application file for complete search history.

(56) References Cited

U.S. PATENT DOCUMENTS

| | | | |
|---|---|---|---|
| 6,356,173 B1 * | 3/2002 | Nagata et al. | 333/247 |
| 6,369,324 B1 | 4/2002 | Tomie | 174/650 |
| 6,433,650 B1 * | 8/2002 | Harju et al. | 333/33 |
| 7,193,490 B2 * | 3/2007 | Shimoda | 333/246 |
| 2009/0033442 A1 | 2/2009 | Zhao et al. | 333/245 |
| 2009/0267712 A1 | 10/2009 | Zhou et al. | 333/238 |

* cited by examiner

*Primary Examiner* — Benny Lee
(74) *Attorney, Agent, or Firm* — JDS Uniphase Corporation

(57) ABSTRACT

A high-speed feedthrough (HSFT) is disclosed for transmitting a signal having a highest frequency of at least 10 GHz between first and second locations separated by a vertical distance of at least approximately half of the shortest transmitted wavelength, and separated by a horizontal distance. A substrate structure includes multiple stacked layers. An RF transmission line is connected through the structure between the first and second locations for transmitting the signal. The RF transmission line comprises a series of sequentially connected horizontal conductors having lengths less than half of the effective wavelength and vertical conductors having heights less than one quarter of the effective wavelength, thereby spanning the horizontal and vertical distance between the two locations in a stairs-like shape through the structure's layers. Each conductor's geometry may deviate from standard 50 ohm buried strip lines and is optimized for complete 3-dimensional structure.

17 Claims, 8 Drawing Sheets

HIGH-SPEED FEEDTHROUGH HAVING A STAIR-LIKE SHAPE TRANSMISSION LINE FORMED THROUGH A MULTI-LAYER SUBSTRATE

CROSS-REFERENCE TO RELATED APPLICATIONS

Priority is claimed from U.S. Patent Application No. 61/405,537 filed Oct. 21, 2010, which is incorporated herein by reference.

TECHNICAL FIELD

The present invention relates to high-speed feedthroughs and more particularly, to broadband non-coplanar high-speed feedthroughs having both vertical and horizontal displacement between the location of their inner and outer terminals.

BACKGROUND OF THE INVENTION

A High-Speed Feedthrough (HSFT) is a circuit structure that provides electrical connectivity over RF transmission lines having two displaced sets of terminals. HSFTs may form part of an electronic multi-chip module (MCM) package where the HSFT provides electrical connectivity between the hermetically sealed interior of the package and the external system or host device. When a HSFT is used in a MCM package, one set of terminals is connected to the MCM internally within the package while the other set of terminals are connected to the host device externally from the package. The HSFT may also form part of the hermetic separation of the package from the host device.

For high-speed applications operating at frequencies of 10 GHz and above, such as opto-electronic telecommunication components, a HSFT should provide compact broadband resonance-free transmission with low losses, minimal inter-channel cross-talk, and small reflection from terminals on both sides of the package.

When designing a HSFT, significant challenges arise when the HSFT must provide connectivity in two dimensions—vertically and horizontally—between its two sets of terminals. Coplanar HSFTs limit the HSFT structure such that all of the terminals and RF transmission lines must lie in the same plane, e.g., the horizontal plane. Accordingly, connectivity in both the horizontal and vertical dimensions is not possible using a coplanar HSFT. While some non-coplanar HSFTs exist for specific scenarios, there has been no universal solution that can accommodate vertical and horizontal displacements that are comparable with, or longer than, half of the shortest wavelength transmitted through the HSFT.

FIG. 1A illustrates an example HSFT 100 having coplanar transmission lines within the same layer. The HSFT 100 in FIG. 1A is described as a coplanar HSFT because the transmission lines are arranged either as coplanar lines or as coplanar buried strip lines on or within the same layer. Coplanar HSFTs are not well suited when there is also vertical displacement between the two sets of terminals.

A non-coplanar HSFT refers to a HSFT where there is vertical displacement between the input and output sets of terminals in addition to horizontal displacement, if any. Some non-coplanar HSFTs, such as described in US Patent Application Publication No. 2009/0033442 and US Patent Application Publication No. 2009/0267712, include a single vertical interconnect, or via, spanning the vertical displacement in each RE transmission line.

Non-coplanar HSFTs having a single via are not well suited when the vertical and horizontal displacements between the two sets of terminals are comparable with, or longer than, half of the shortest wavelength transmitted through the HSFT. A distance, length or height is comparable with, proportional to, or approximately half of a wavelength when the distance, length or height is within the range of about 25% to about 75% of the wavelength.

In FIG. 1B a single via non-coplanar HSFT 150 is illustrated within a package 160. The package 160 includes a hermetic seal 170. For simplicity, only one RF transmission line is illustrated in FIG. 1B although others could be present. A single via spans multiple layers of the non-coplanar HSFT 150. This via cannot be described as an ideal microwave transmission line. Furthermore, when the vertical length of the via is comparable with, or longer than, half of the effective wavelength in the substrate material ($\lambda_{ef}$), the via fails due to resonances and excessive cross-talk. Accordingly, non-coplanar HSFTs having a single via, including HSFT 150, are not well suited when the vertical and horizontal displacements between the two sets of terminals are comparable with, or longer than, half of the shortest wavelength transmitted through the HSFT.

Another non-coplanar HSFT design uses a sequence of vias without horizontal traces. The via in each ceramic or substrate layer is shifted horizontally while still partially overlapping with the vias in the layers above and below it. This design avoids resonance from a long single via; however, it cannot easily accommodate horizontal displacement. Since a via diameter is typically quite small, many ceramic layers (typically much more than 10, and preferably as much as 40) are required to span the horizontal displacement between the HSFT's sets of terminals. This design is not compact due to the large number of layers required. Furthermore, this design is expensive because it requires precise positioning of via channels and metallization in each layer. Accordingly, non-coplanar HSFTs having a sequence of progressively shifted vias are not well suited when the vertical and horizontal displacement between the two sets of terminals are comparable with, or longer than, half of the shortest wavelength transmitted through the HSFT.

A variant of the coplanar/non-coplanar HSFTs is described in U.S. Pat. No. 6,369,324. In that patent, each RF transmission line includes a pair of vias in the same substrate layer which route the RF transmission line beneath a hermetic sealing wall to improve the reliability of the hermetic seal. This patent does not appear to contemplate designing an HSFT having vertical and horizontal displacements between its two sets of terminals that are comparable with, or longer than, half of the shortest wavelength transmitted through the HSFT.

SUMMARY OF THE INVENTION

The present disclosure describes compact broadband multi-layer non-coplanar non-standard impedance high-speed feedthroughs. For non-limiting example, the present disclosure provides an 8-channel non-coplanar staggered HSFT operational over a spectral range from 10 kHz up to 30 GHz comprising 10 or less ceramics layers between ground lines. Each RF transmission line comprises a stairs-like sequence of alternating horizontal conductors and short vias spanning the horizontal and vertical displacement between the HSFT's two sets of terminals. The geometry of each conductor is too small for the resulting electromagnetic field to be modeled using one of the standard transverse modes. Accordingly, the entire HSFT is optimized as a 3-dimensional structure and as a result the geometry of each conductor may deviate from standard 50 ohm buried strip line transmission lines by as much as about +/−10 ohms.

An embodiment of the present disclosure provides a high-speed feedthrough (HSFT) for transmitting a signal, having a highest frequency of at least 10 GHz corresponding to a shortest free space wavelength, between a first interface location and a second interface location that are separated by a vertical distance of at least a millimeter, and separated by a horizontal distance. The HSFT comprises: a substrate structure comprising multiple stacked layers; and an RF transmission line connected through the substrate structure between the first and second locations for transmitting the signal between the first and second locations, the RF transmission line comprising a series of sequentially connected horizontal and vertical conductors; the horizontal conductors having lengths less than half of an effective wavelength that corresponds to the shortest free space wavelength of the signal when transmitted through the HSFT, and the vertical conductors having heights less than one quarter of the effective wavelength; thereby spanning the horizontal and vertical distance between the two locations in a stairs-like shape through the layers of the substrate structure.

A further embodiment of the present disclosure provides a high-speed feedthrough (HSFT) for transmitting a signal having a highest frequency of at least 10 GHz corresponding to a shortest free space wavelength. The HSFT comprises: a multilayered substrate structure having an effective wavelength for the shortest wavelength; a first terminal connected to the structure; a second terminal connected to the structure and separated from the first terminal by a vertical distance and a horizontal distance, both distances proportional to or greater than half of the shortest wavelength; and an RF transmission line connecting the first and second terminals through the multilayered substrate structure, the RF transmission line comprising a series of horizontal conductors having lengths less than half of the effective wavelength connected to vertical conductors having heights less than one quarter of the effective wavelength; wherein adjacent horizontal and vertical conductors are progressively horizontally and vertically shifted from the first terminal towards the second terminal.

BRIEF DESCRIPTION OF THE DRAWINGS

Embodiments of the present disclosure are described with reference to the following figures.

DETAILED DESCRIPTION OF THE INVENTION

While preferred embodiments may be illustrated or described, they are not intended to limit the invention. Rather, numerous changes including alternatives, modifications and equivalents may be made as would be understood by the person skilled in the art. As always, the invention is defined by the appended claims.

Figure 1A:
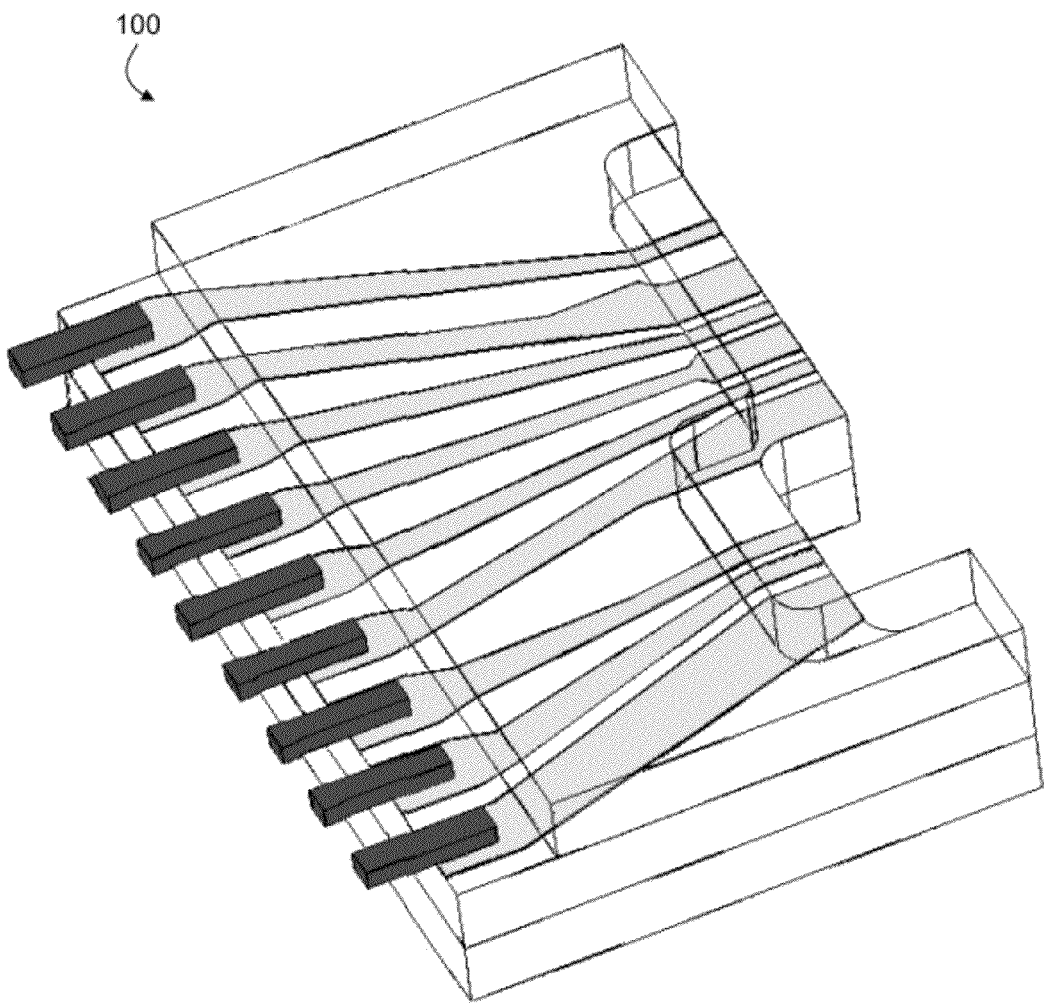
FIG. 1A is a partially transparent perspective schematic illustration of a prior art coplanar HSFT.
Figure 1B:
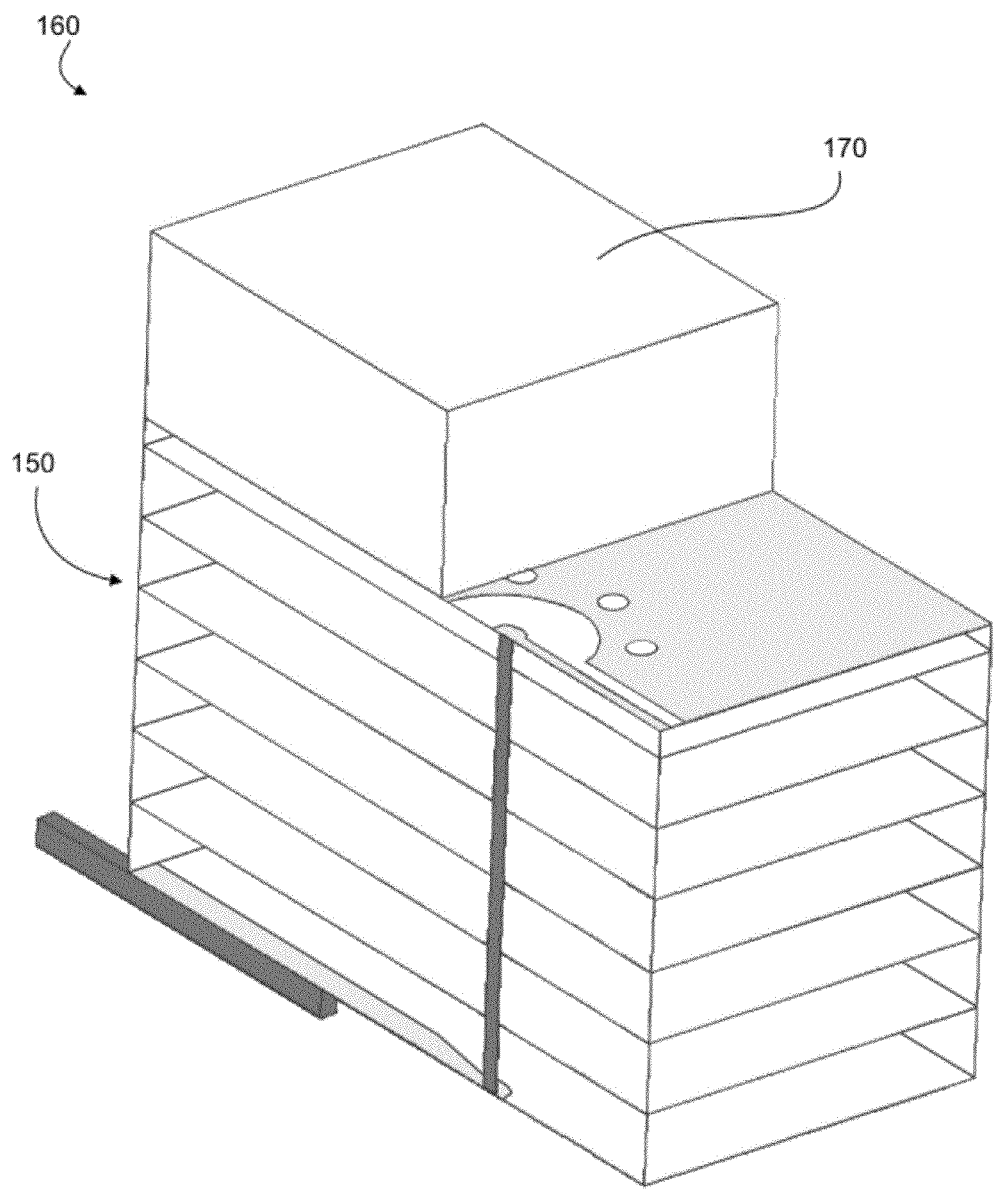
FIG. 1B is a partially transparent cross-sectional perspective schematic illustration of a prior art single via non-coplanar HSFT.
Figure 2A:
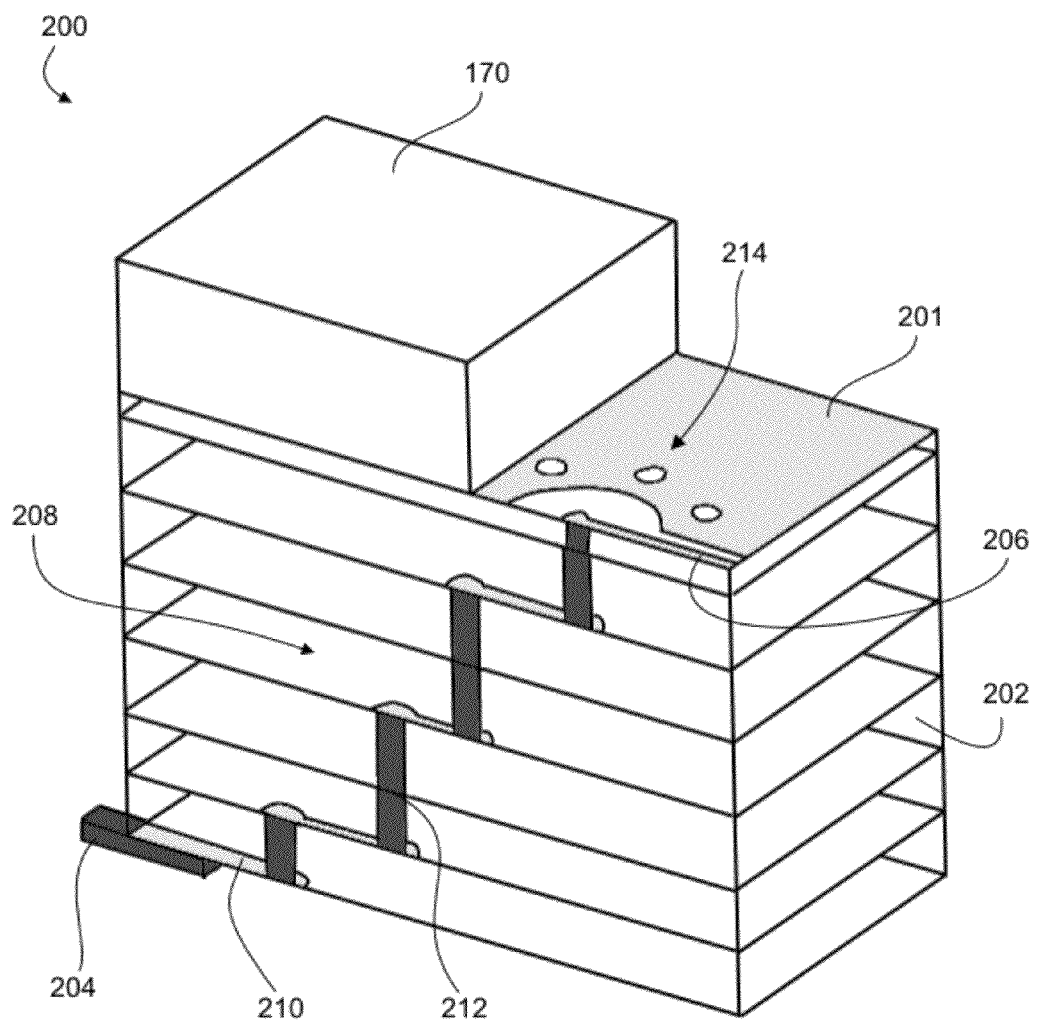
FIG. 2A is a partially transparent cross-sectional perspective schematic illustration of an embodiment of the present disclosure.
Figure 2B:
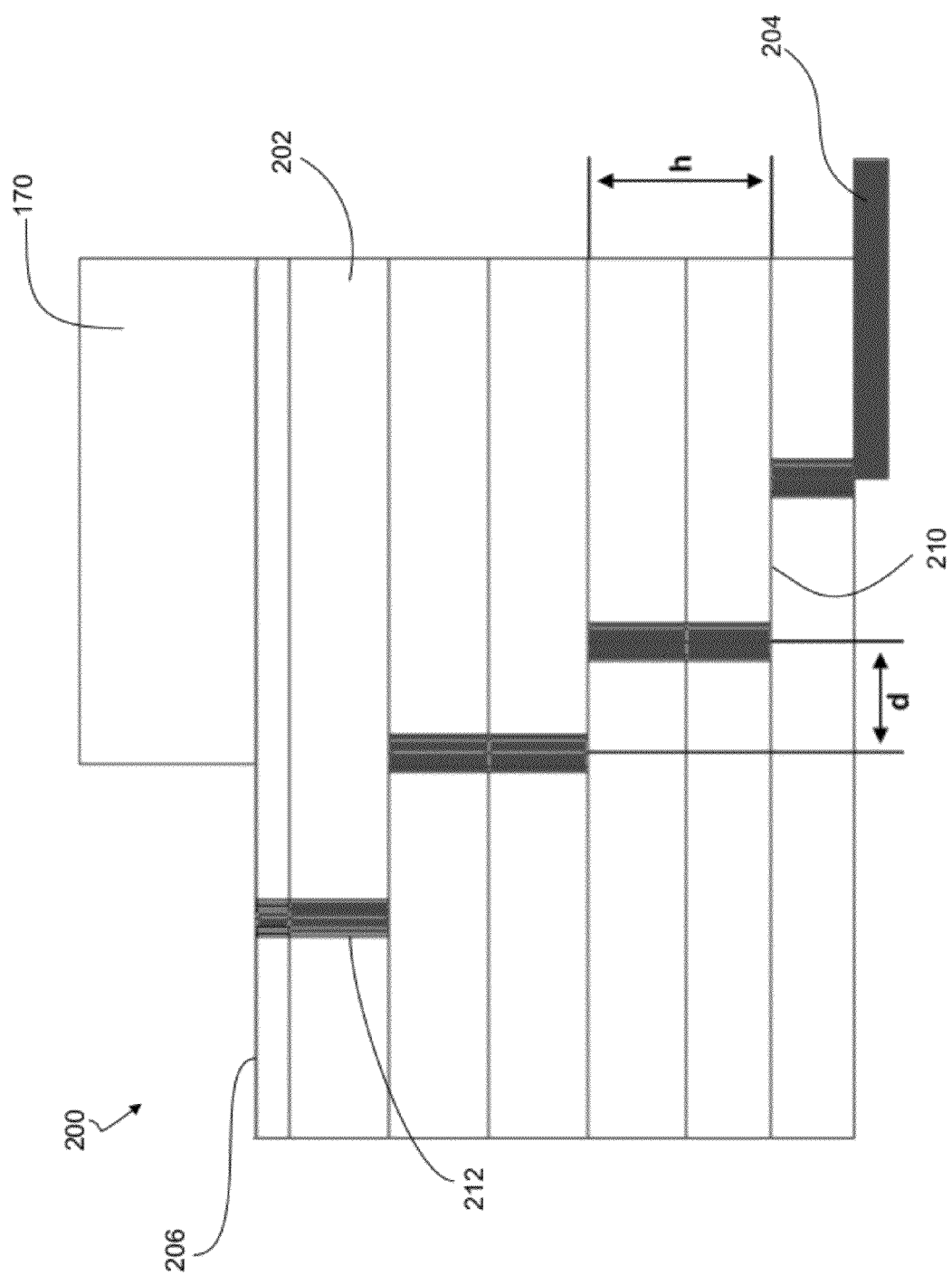
FIG. 2B is a cross-sectional side view of the embodiment of FIG. 2A.
Figure 2C:
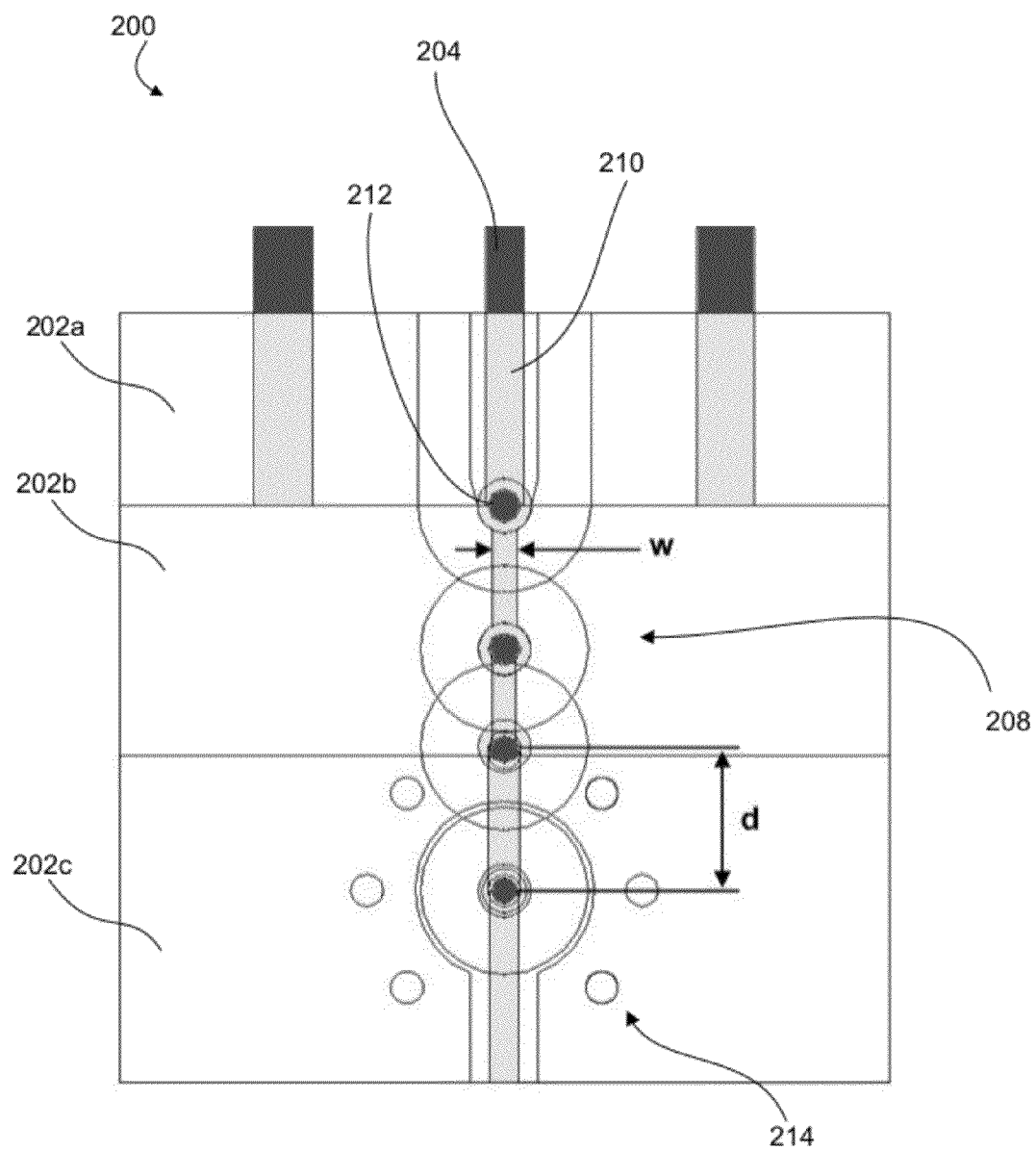
FIG. 2C is a partially transparent top view of the embodiment of FIG. 2A.

Referring collectively to FIGS. 2A, 2B and 2C, an embodiment of the present disclosure, HSFT 200, is illustrated. For simplicity only one complete RF transmission line 208 is illustrated although others may also be present in HSFT 200. HSFT 200 provides a compact design for transmitting a broad band of signals having spectral range from about 10 kHz to up to about 30 GHz including signals having a shortest free space wavelength between about 10 millimeters and about 50 millimeters. The HSFT 200 provides resonance-free transmission, low losses, minimal inter-channel cross-talk, and small reflection from terminals. Furthermore, the HSFT 200 can accommodate vertical and horizontal displacement between terminals that are comparable with, or longer than, half of the shortest wavelength ($\lambda$) transmitted through the HSFT 200.

While the structures of HSFT 200 geometrically resemble buried strip lines, coplanar lines and other traditional structures, the smaller dimensions of conductors of the HSFT 200 prevent accurate modeling by ideal transmission line theory based on those traditional structures. While geometrically resembling traditional structures in some ways, the HSFT 200 cannot be accurately described using standard assumptions of transmission line theory, and thus should be modeled and optimized as a whole 3-dimensional structure.

Traditional HSFT designs adhere to standard assumptions of transmission line theory such as the impedance matching rule which imposes strict relationships on dimensions of the segments of the RF transmission line versus layer thickness and dielectric of choice; however, when dimensions of the 3-dimensional structure are comparable with half of the transmitted wavelength, the resulting electromagnetic field cannot be accurately modeled by one of the standard transverse modes, such as TEM for transmission lines, or TE or TM for regular waveguides. When the dimensions of the 3-dimensional structure are comparable with half of the transmitted wavelength, the ratio E/H, where E is the electric field strength, and H is the magnetic field strength, may vary at every given spatial point. Accordingly, the traditional definition of impedance becomes ambiguous: traditionally, $Z(x) \sim E(x)/H(x)$ where Z is impedance, E is the electric field strength, H is the magnetic field strength, and x is the reference position where impedance Z(x) is calculated. Accordingly, the HSFT 200 should be studied and optimized as a whole 3-dimensional structure and may ignore traditional HSFT design constraints. For example, the conductors may vary between about 40 and about 60 ohms.

As HSFT 200 is not restricted by canonical transmission line theory or its standard assumptions like TEM mode of propagating fields, HSFT 200 delivers much more flexibility in design, improving manufacturability and reducing tolerance sensitivity, without compromising the device performance. The HSFT 200 is one of the first high-speed non-coplanar feedthrough designs which is a key component of packages for receivers operating at 40 Gbps or 100 Gbps, i.e., 40 G/100 G receivers. It is a low cost, simple manufacturing, short lead time HSFT compatible with many suppliers which can be very valuable to the 40 G/100 G receiver business.

The HSFT 200 may also include ground lines 201 (FIG. 2A) above and/or below the layered substrate structure and ground vias 214 (FIGS. 2A and 2C). The HSFT 200 may include, or be integrated into, a hermetic seal 170 (FIGS. 2A and 2B). HSFT 200 may form part of a wide variety of MCM packages, transceivers, transmitters, opto-electronic circuitry and other devices.

The HSFT 200 comprises a multiple layer structure 202 (FIGS. 2A and 2B) comprising ceramic, dielectric or other known substrate layers. A first terminal 204 on one side of the HSFT 200 and a second terminal 206 (FIGS. 2A and 2B) on the other side of the HSFT 200 are connected to the substrate structure 202. The first terminal 204 and the second terminal 206 are separated from each other by a vertical distance and a horizontal distance. Both these distances are comparable with, or longer than, half of the shortest wavelength of the signal that will be transmitted through the HSFT 200. Typically, the wavelength used is the effective wavelength $\lambda_{ef}$ of the transmitted signal calculated in the material of the HSFT 200, and not the free space wavelength of the signal in air. The wavelength for standard transmission line $\lambda_{ef}$ can be approximately calculated by dividing its free space wavelength $\lambda$ by the square root of the effective dielectric constant of the substrate material. Generally, it is both the substrate material and the type of transmission line that define the effective wavelength; however in some embodiments, the effective dielectric constant of the substrate material dominates.

In FIG. 2A, the first terminal 204 is illustrated as a separate physical structure, a lead, while the second terminal 206 is illustrated as a bonding pad; however, terminal 204 may form an end portion or interface location of the RF transmission line 208 or be omitted entirely, allowing direct connection of the RF transmission line 208 to a hoard, MCM within a package, host device external to a package, or other structure. The terminals 204, 206 may comprise lead, bonding pads, solder balls or other types of interconnect or conductor.

The RF transmission line 208 electrically connects the first terminal 204 and the second terminal 206 through the multi-layered substrate structure 202 and transmits a broad band signal between the two terminals including a shortest wavelength in the range of about 10 to about 50 millimeters. The RF transmission line 208 combines short horizontally elongated conductors 210 electrically connected to relatively short vertical conductors 212. This allows reducing vertical conductor height h (FIG. 2B) to provide resonance-free operation while at the same time reducing the number of layers of structure 202 since the horizontal conductors 210 provide sufficiently separation d (FIG. 2B) between the vertical conductors 212.

In one example embodiment where the vertically lowest location is the first terminal 204, the structure of the RF transmission line 208 can be described as follows. Starting from the first terminal 204, both the horizontal conductors 210 and the vertical conductors 212 are progressively horizontally shifted relative to one another for successively higher layers of the structure 202 with an exception being where a vertical conductor 212 spans multiple layers of the structure 202. If the first portion of the RF transmission line 208 is a first horizontal conductor 210 on top of a first layer of the structure 202, the end of the first conductor horizontally distal from the first terminal 204 is connected to the end of a vertical conductor 212 that is vertically proximate to the first terminal 204. This vertical conductor 212 extends through one or more layers of the substrate structure 202. The vertically distal end of the vertical conductor 212 is connected to the horizontally proximate end of a second horizontal conductor 210. This second horizontal conductor 210 is horizontally shifted away from the first terminal 204 and towards the second terminal 206 relative to the first horizontal conductor 210. This pattern repeats adding a second vertical conductor 212, etc. until the RF transmission line connects to the second terminal 206. In this manner, RF transmission line 208 presents a stairs-like shape through the layered substrate structure 202 from a first location to a vertically higher and horizontally displaced second location. As described below, there are constraints on the dimensions of the horizontal and vertical conductors 212, 210 to ensure optimal signal transmission through the HSFT 200. One skilled in the art will readily understand, this pattern may commence with either a horizontal or vertical conductor 210, 212 and may easily be reversed from a highest terminal or interface location to a lowest terminal or interface location without deviating from the present disclosure.

The horizontal conductors 210 may be geometrically similar to coplanar line, strip line, buried line, or other manner of electrical conductors in, on or otherwise associated with a substrate layer. As illustrated in FIG. 2B, all the horizontal conductors 210 are similar to coplanar strip lines on top of each layer. The length d (FIGS. 2B and 2C) of each horizontal conductor 210 is less than half of the effective wavelength $\lambda_{ef}$. Horizontal conductor 210 length d is too short to be described using ideal microwave transmission theory. Consequently, the whole system including the HSFT 200 is considered and modeled as a 3-dimensional electromagnetic system. While presenting some design challenges, modeling the whole system permits the opportunity to optimize the dimensions of each horizontal conductor, vertical interconnect and substrate layer for overall HSFT performance rather than conforming to microwave transmission line theory such as trying to satisfy the 50 ohm impedance matching requirements. For example, the width w (FIG. 2C) of internal horizontal conductors may deviate significantly (by more than 10%) from ideal 50 ohm transmission line in the material of the HSFT 200. Accordingly, the length, width, thickness and substrate-depth of the horizontal conductors 210 of each layer can be individually determined for each layer by modeling and need not be restricted to the dimensions normally necessary to satisfy standard impedance matching rules.

The vertical conductors 212 may comprise vertical interconnects, through vias, filled vias, hollow vias, via pads, other via structures or other vertical conductors. The height h (FIG. 2B) of each vertical conductor 212 is less than $\lambda_{ef}/4$. As above, $\lambda_{ef}$ is the shortest effective wavelength of transmitted signal where the index "ef" indicates that the wavelength should be calculated in the material of the HSFT 200. Splitting the total vertical distance between terminals 204, 206 in this manner avoids resonance in the vertical conductors 212. A single vertical conductors 212 may pass through multiple layers of substrate structure 202 or a single vertical conductor 212 may be formed from multiple vertical interconnects connected in adjacent layers without any horizontal displacement between the vertical interconnects.

Figure 2D:
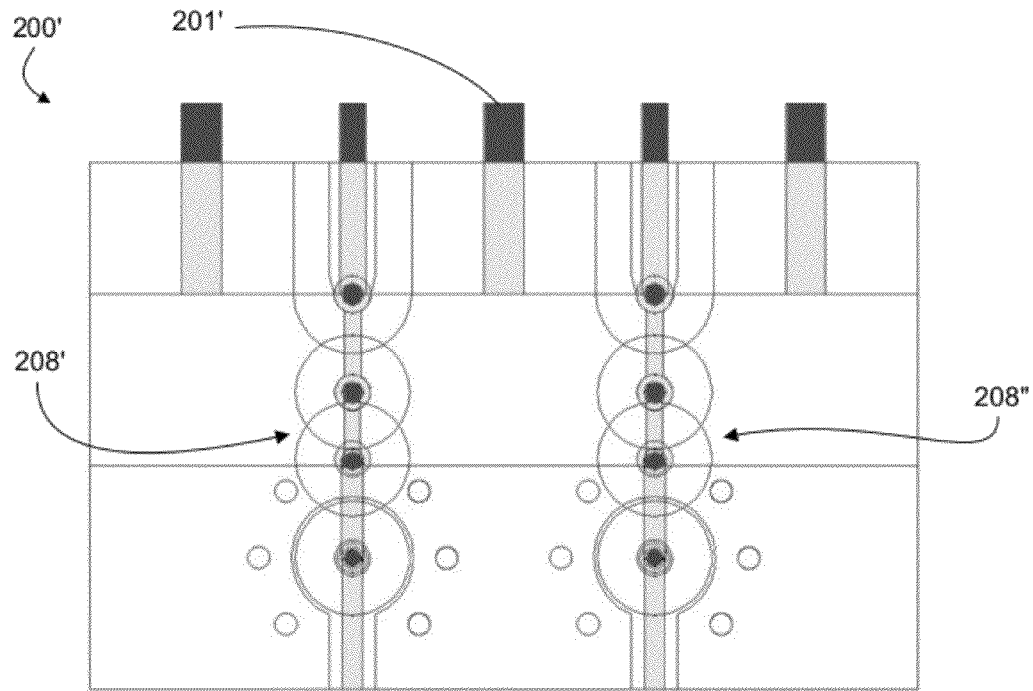
FIG. 2D is a partially transparent top view of a further embodiment.
Figure 2E:
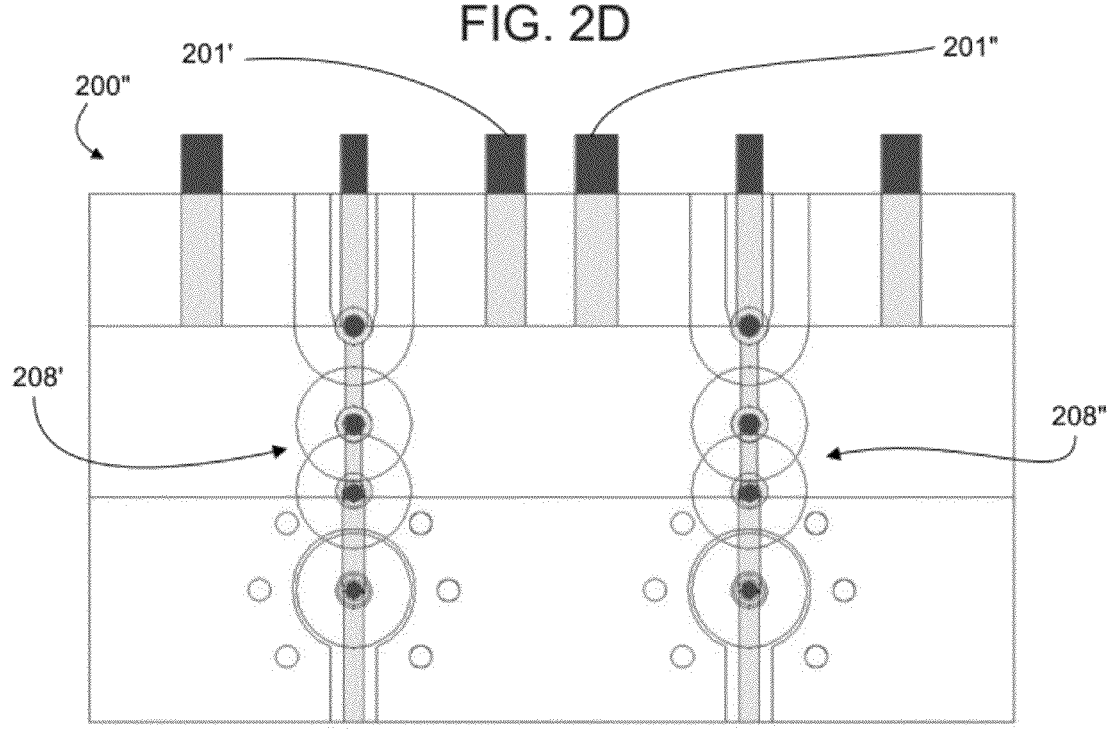
FIG. 2E is a partially transparent top view of another embodiment.

Referring specifically to the top view of HSFT 200 in FIG. 2C, various layers of the substrate structure 202 are partially cut away, so that layers 202a, 202b, 202c are visible. In the first visible layer 202a, a first conducting trace 210 is connected to the first terminal 204 and a first vertical conductor 212. The series of sequentially connected horizontal conductors 210 having lengths less than half of the effective wavelength $\lambda_{ef}$ are connected by vertical conductors 212. The structure presented in FIG. 2C illustrates a single RF channel. Other embodiments may include several RF channels merged together either with common or separate grounds. FIG. 2D illustrates a HSFT 200' having two channels 208', 208" and a common ground 201', but as many channels as necessary can be included. Each RF transmission line 208', 208" may comprise a single channel of the HSFT 200'. FIG. 2E illustrates a further HSFT 200" having two channels 208', 208" but each with separate grounds 201', 201".

Figure 3:
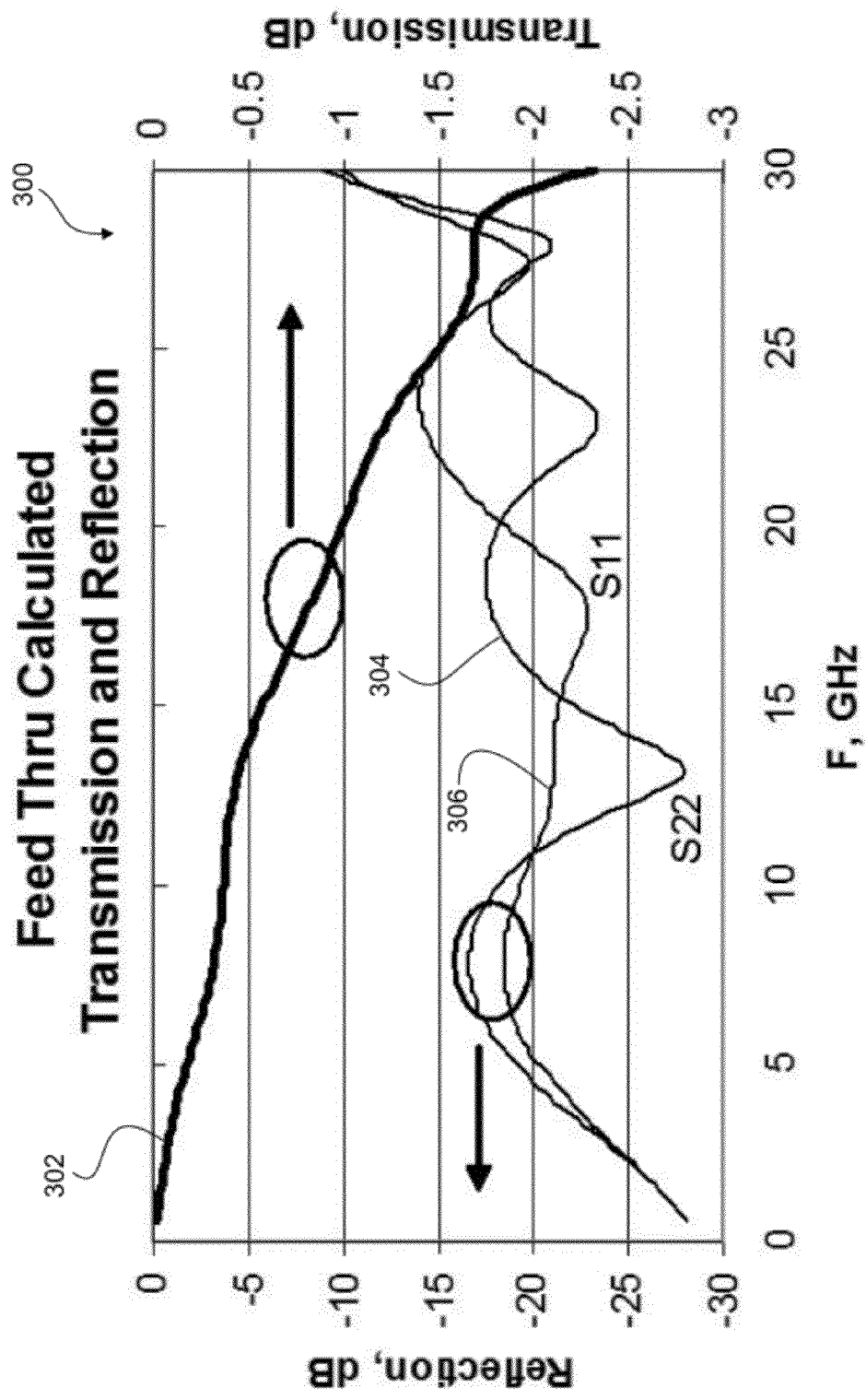
FIG. 3 is a graphical representation of simulated transmission and reflection losses of an embodiment of the present disclosure.

As a non-limiting example, an HSFT 200 for transmitting a signal having a broad spectral range of 10 kHz to 30 GHz corresponding to a shortest free space wavelength of 10 mm and an effective wavelength of about 3 mm may comprise a compact structure 202 having 7 ceramic layers with first and second interface locations 204, 206 having vertical displacement over 4 mm and horizontal displacement of about 3 mm. This example HSFT 200 combines relatively short vertical conductors 212 with manufacturable ceramic thickness. FIG. 3 illustrates a graphical representation 300 of calculated performance of this HSFT for frequencies F spanning approximately 10 kHz to 30 GHz on the x-axis. Transmission losses 302 and reflection losses 304, 306 are represented in decibels on the two y-axes. The S11 curve 306 represents the amount of power being rejected by the structure when the source is from the second interface location 206, and the rejected amount reflects back towards the source and does not make it to the output at the first interface location 204. The S22 curve 304 represents the amount of power being rejected by the structure when the source is from the first interface location 204, and the rejected amount reflects back towards the source and does not make it to the output at the second interface location 206. Resonance-free transmission is illustrated up to 30 GHz with losses less than 3 dB. The reflection from inner and outer terminals is below −10 dB within this frequency bandwidth.

Figure 4:
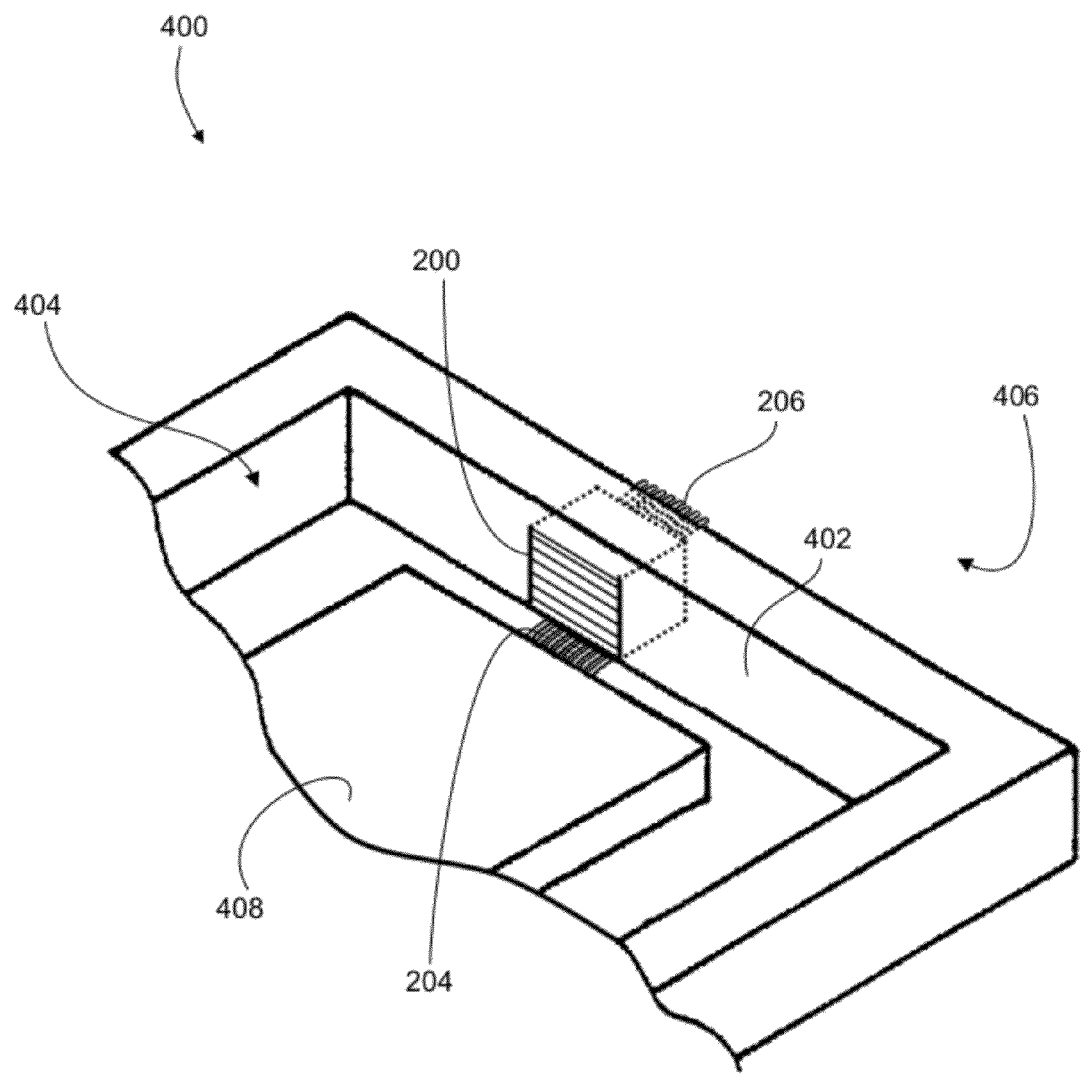
FIG. 4 is a partially cut away perspective view of a yet further embodiment of the present disclosure.

In a further embodiment illustrated in FIG. 4, a package 400 is provided comprising a hermetic seal 402 defining an interior 404 and an exterior 406 of the package 400 and at least one HSFT 200 embedded within the hermetic seal 402. A chip or MCM 408 may be included in the interior 404 of the package 400 connected to the terminals 204 on the side of the HSFT 200 that is interior to the package 400. The terminals 206 on the other side of the HSFT 200 are exposed to the exterior 406 of the package 400 and may be used to connect to a host device or other external system (not shown).

We claim:

1. A high-speed feedthrough (HSFT) operative to transmit a signal, having a highest frequency of at least 10 GHz corresponding to a shortest free space wavelength, between a first interface location and a second interface location that are separated by a vertical distance of at least a millimeter, and separated by a horizontal distance, the HSFT comprising:
    a substrate structure comprising multiple stacked layers; and
    an RF transmission line connected through the substrate structure between the first and second interface locations operative to transmit the signal between the first and second interface locations, the RF transmission line comprising a series of sequentially connected horizontal and vertical conductors; the horizontal conductors having lengths less than half of an effective wavelength that corresponds to the shortest free space wavelength of the signal when transmitted through the HSFT, and the vertical conductors having heights less than one quarter of the effective wavelength; thereby spanning the horizontal and vertical distances between the first and second interface locations in a stairs-like shape through the layers of the substrate structure.

2. The HSFT of claim 1 wherein the stairs-like shape through the layers of the substrate structure comprises:
    the horizontal conductors being progressively horizontally and vertically shifted for different layers of the substrate structure from a location proximate the first interface location to a location proximate the second interface location; and
    the vertical conductors connecting vertically overlapping ends of adjacent horizontal conductors through one or more layers of the substrate structure.

3. The HSFT of claim 1 wherein the horizontal and vertical conductors have geometries deviating from 50 ohm transmission lines in the material of the substrate and have impedances in the range from about 40 ohms to about 60 ohms.

4. The HSFT of claim 1 wherein the horizontal distance between the first interface location and the second interface location is at least a millimeter.

5. The HSFT of claim 1 wherein at least one of the horizontal conductors has a width that varies from that of an ideal 50 ohm transmission line in the material of the substrate by more than 10 percent.

6. The HSFT of claim 1 wherein the substrate structure comprises 10 or less ceramic layers.

7. The HSFT of claim 1 wherein the signal comprises a spectral range from about 10 kHz to about 30 GHz corresponding to a shortest free space wavelength of about 10 millimeters.

8. The HSFT of claim 7 wherein the substrate structure comprises 7 ceramic layers.

9. The HSFT of claim 8 wherein the vertical distance between the first interface location and the second interface location is at least 3 millimeters.

10. The HSFT of claim 9 wherein the horizontal distance between the first interface location and the second interface location is at least 3 millimeters.

11. The HSFT of claim 1 further comprising grounded coplanar lines at the top and bottom layers of the substrate structure.

12. The HSFT of claim 1 wherein the horizontal conductors are coplanar strip lines.

13. The HSFT of claim 1 further comprising at least one of a first terminal electrically connected to the first interface location; and a second terminal electrically connected to the second interface location.

14. The HSFT of claim 1 further comprising another seven RF transmission lines within the HSFT.

15. A package comprising:
    a hermetic seal defining an interior and an exterior of the package;
    a HSFT according to claim 1 embedded within the hermetic seal;
    a chip within the interior of the package connected to the first interface location of the HSFT;
    outer terminals connected to the second interface location of the HSFT and exposed to the exterior of the package.

16. A high-speed feedthrough (HSFT) operative to transmit a signal having a highest frequency of at least 10 GHz corresponding to a shortest free space wavelength, the HSFT comprising:
    a multilayered substrate structure;
    a first terminal connected to the structure;
    a second terminal connected to the structure and separated from the first terminal by a vertical distance and a horizontal distance, both distances approximate to or greater than half of an effective wavelength that corresponds to the shortest free space wavelength of the signal when transmitted through the HSFT;
    an RF transmission line connecting the first and second terminals through the multilayered substrate structure, the RF transmission line comprising a series of horizontal conductors having lengths less than half of the effective wavelength, the series of horizontal conductors connected to a series of vertical conductors having heights less than one quarter of the effective wavelength;

wherein adjacent horizontal and vertical conductors are progressively horizontally and vertically shifted from the first terminal towards the second terminal.

17. A package comprising:

a hermetic seal defining an interior and an exterior of the package;

a HSFT according to claim 16 embedded within the hermetic seal exposing the second terminal to the exterior of the package; and a chip within the interior of the package connected to the first terminal of the HSFT.

\* \* \* \* \*